(12) United States Patent
Khusnatdinov

(10) Patent No.: US 12,152,162 B2
(45) Date of Patent: Nov. 26, 2024

(54) METHOD OF FORMING A PHOTO-CURED LAYER

(71) Applicant: CANON KABUSHIKI KAISHA, Tokyo (JP)

(72) Inventor: Niyaz Khusnatdinov, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 76 days.

(21) Appl. No.: 17/538,621

(22) Filed: Nov. 30, 2021

(65) Prior Publication Data

US 2023/0167305 A1    Jun. 1, 2023

(51) Int. Cl.

| | |
|---|---|
| C09D 4/00 | (2006.01) |
| B05D 3/06 | (2006.01) |
| C08F 220/18 | (2006.01) |
| C08F 222/10 | (2006.01) |
| C09D 5/00 | (2006.01) |
| C09D 133/08 | (2006.01) |
| C09D 135/02 | (2006.01) |

(52) U.S. Cl.
CPC .............. *C09D 4/00* (2013.01); *B05D 3/067* (2013.01); *C08F 220/1807* (2020.02); *C08F 222/102* (2020.02); *C09D 5/002* (2013.01); *C09D 133/08* (2013.01); *C09D 135/02* (2013.01)

(58) Field of Classification Search
CPC ........ C09D 4/00; C09D 5/002; C09D 133/08; C09D 135/02; C08F 220/1807; C08F 222/102; B05D 3/067
See application file for complete search history.

(56) References Cited

U.S. PATENT DOCUMENTS

| | | | |
|---|---|---|---|
| 8,647,554 B2 | 2/2014 | Jones | |
| 9,381,540 B2 | 7/2016 | Koshiba | |
| 9,662,678 B2 | 5/2017 | Schram | |
| 2006/0036051 A1 | 2/2006 | Xu | |
| 2010/0286811 A1 | 11/2010 | Jones | |
| 2018/0272634 A1 | 9/2018 | Khusnatdinov | |

FOREIGN PATENT DOCUMENTS

| | | |
|---|---|---|
| JP | 2017162923 A | 9/2017 |
| WO | 2018027073 A1 | 2/2018 |

*Primary Examiner* — Robert S Walters, Jr.
(74) *Attorney, Agent, or Firm* — Abel Schillinger, LLP

(57) ABSTRACT

A method of forming a photo-cured layer on a substrate can comprise using a first photocurable composition and a second photocurable composition, wherein both photocurable compositions may contain the same types of polymerizable monomers but in different concentration ratios. The concentration ratios of the monomers in each of the two photocurable compositions can be adapted that the uneven loss of one type of monomer from the first photocurable composition due to unwanted evaporation in certain regions of the substrate may be compensated by the second photocurable composition, which contains a higher amount of said monomer. The two photocurable compositions can further be adapted to easily merge to a combined layer with a very even distribution of the polymerizable monomers. This may allow forming photo-cured layers having an excellent homogeneous material structure throughout the layer.

20 Claims, 2 Drawing Sheets

METHOD OF FORMING A PHOTO-CURED LAYER

FIELD OF THE DISCLOSURE

The present disclosure relates to a method of forming a photo-cured layer on a substrate, particularly to a method of forming a photo-cured layer having a homogeneous material structure.

BACKGROUND

Many imprint resist compositions include a plurality of components, for example, two or more polymerizable monomers, which can have a large variety in their vapor pressure. During IAP and NIL processing, it has been observed that the monomer with the highest vapor pressure of a resist composition may evaporate at a greater rate than the other components of the resist, and that such unwanted non-uniform evaporation may be at different locations on the substrate, for example the edge regions or within the center region of the substrate. There exists a need to compensate uneven resist evaporation to ensure a required resist volume for effective planarization throughout the wafer, and to compensate composition changes. Maintaining an even weight percent ratio of the resist components to each other throughout an applied resist layer may produce photo-cured resist layers having a very even etch rate, and other material properties, like Young's modulus, or thermal shrinkage.

SUMMARY

In one embodiment, a method of forming a photo-cured layer on a substrate can comprise: applying a first photocurable composition overlying at least a first region of the substrate, the first photocurable composition comprising a first polymerizable material; applying a second photocurable composition overlying at least partially the first photocurable composition and/or at least a second region of the substrate, the second photocurable composition comprising a second polymerizable material; contacting the first photocurable composition and the second photocurable composition with a superstrate or template to form a combined liquid photocurable layer; photo-curing the combined liquid layer to form the photo-cured layer; and removing the superstrate or template, wherein the first polymerizable material and the second polymerizable material both comprise a first monomer and a second monomer, and wherein a ratio of a vapor pressure of the first monomer to a vapor pressure of the second monomer is at least 3; and the first polymerizable material comprises a first weight percent ratio of the first monomer to the second monomer, the second polymerizable material comprises a second weight percent ratio of the first monomer to the second monomer, wherein the first weight percent ratio is different than the second weight percent ratio.

In one aspect of the method, an amount and location of applying the second photocurable composition are pre-calculated to compensate for an evaporation of the first photocurable composition.

In another aspect of the method, the photo-cured layer can have an etch rate variation of not greater than 5%.

In a further aspect, the first monomer can have a vapor pressure of at least 0.01 mm Hg.

In a particular aspect, the combined layer can comprise a third weight percent ratio of the first monomer to the second monomer, and the third weight percent ratio can be substantially the same as the first weight percent ratio.

In another particular aspect, the combined layer can comprise a third weight percent ratio of the first monomer to the second monomer, and the first weight percent ratio, the second weight percent ratio, and the third weight percent ratio can be different.

In another embodiment, the second weight percent ratio of the first monomer to the second monomer can be greater than the first weight percent ratio of the first monomer to the second monomer.

In one aspect of the method, the difference between the second weight percent ratio of first to second monomer and the first weight percent ratio of first to second monomer can be at least 1.5.

In another embodiment of the method, the photo-cured layer can have a carbon content variation throughout the photo-cured layer of not greater than 2.0%. In a certain particular aspect, the carbon content variation may be not greater than 1.0%.

In one embodiment of the method, the first monomer of the first and second photocurable compositions can be a mono-functional monomer and the second monomer can be a multi-functional monomer.

In another embodiment of the method, the first monomer of the first and second photocurable compositions can be an acrylate monomer.

In a further embodiment of the method, the first monomer and the second monomer of the first and second photocurable compositions can be an acrylate monomer.

In one embodiment, the ratio of the vapor pressure of the first monomer to the vapor pressure of the second monomer contained in the first and second photocurable compositions can be at least 7.

In another embodiment of the method, the amount of the first photocurable material of the first photocurable composition can be at least 80 wt % based on the total weight of the first photocurable composition, and the amount of the second photocurable material of the second photocurable composition can be at least 80 wt % based on the total weight of the second photocurable composition.

In certain embodiments, the method can be adapted for nanoimprint lithography or inkjet adaptive planarization, wherein the first photocurable composition may be a first imprint resist, and the second photocurable composition may be a second imprint resist.

In one embodiment of the method, the viscosity of the first photocurable composition can be not greater than 50 mPa s, and the viscosity of the second photocurable composition can be not greater than 50 mPa s.

In a certain embodiment, the photo-cured layer can have an etch-rate variation of not greater than 1%.

In another embodiment, a method of forming an article can comprise conducting the above-described method of forming a photo-cured layer on a substrate, and processing the substrate with the photo-cured layer to make the article.

BRIEF DESCRIPTION OF THE DRAWINGS

Embodiments are illustrated by way of example and are not limited in the accompanying figure.

Figure 1:
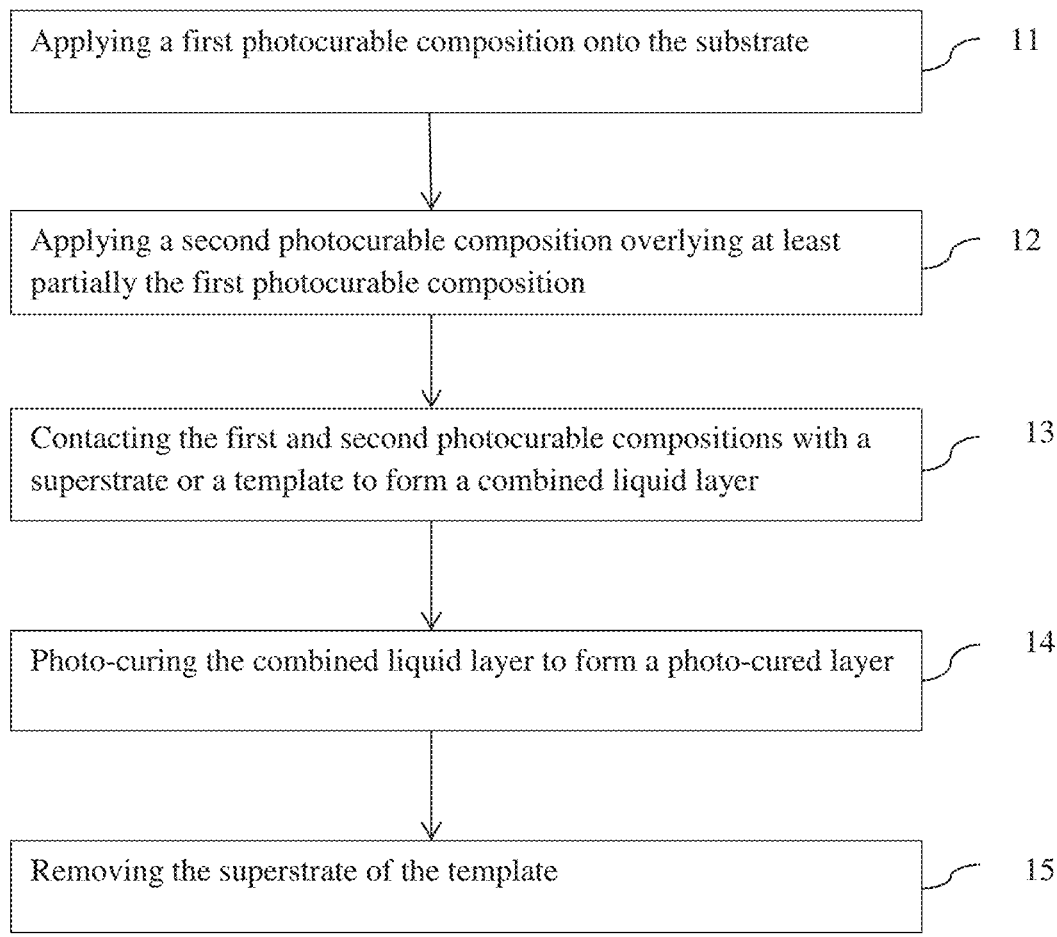
FIG. 1 includes a scheme describing a method of forming a cured layer according to one embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a method of forming a photo-cured layer on a substrate. The method can compensate uneven evaporation of polymerizable monomers from the polymerizable composition during forming the photo-cured layer and thereby may produce photo-cured layers with a very homogeneous structure throughout the layer.

As used herein, "homogenous structure" of the photo-cured layer relates to the polymerized material after photo-curing. In certain aspects, the homogeneous structure can be indirectly expressed as having a very minor etch rate variation throughout the layer or an even carbon content distribution.

In one embodiment, the method of the present disclosure can comprise using two photocurable compositions (herein called "first photocurable composition" and "second photocurable composition"), wherein both photocurable compositions may contain the same types of polymerizable monomers but in different concentration ratios. The concentration ratios of the monomers in each of the two photocurable compositions can be adapted that the uneven loss of one type of monomer from the first photocurable composition due to unwanted evaporation in certain regions of the substrate may be compensated by the second photocurable composition, which contains a higher amount of said monomer. The two photocurable compositions can further be adapted to easily merge to a combined layer with a very even distribution of the polymerizable monomers. This may allow forming photo-cured layers having an excellent homogeneous material structure throughout the layer.

In one embodiment, as illustrated in FIG. 1, the method can comprise the following steps: 11) applying a first photocurable composition overlying at least a first region of the substrate, the first photocurable composition comprising a first polymerizable material; 12) applying a second photocurable composition overlying at least partially the first photocurable composition, the second photocurable composition comprising a second polymerizable material; 13) contacting the first photocurable composition and the second photocurable composition with a superstrate or template to form a combined liquid photocurable layer; 14) photo-curing the combined liquid layer to form the photo-cured layer; and 15) removing the superstrate or template. The first polymerizable material and the second polymerizable material can both comprise a first monomer and a second monomer, wherein the first monomer and the second monomer are in both compositions of the same type, but may have a different weight percent ratio to each other.

In a particular aspect all ingredients of the first polymerizable material can be the same as in the ingredients of the second polymerizable material, and only the weight percent ratios between the first and second monomer may be different. As used herein, ingredients of the polymerizable material relate to at least two polymerizable monomers (herein called first monomer and second monomer), but can further include other monomer types, polymerizable oligomers, polymerizable polymers, or combinations thereof. The amount of ingredients of the polymerizable material may not be limited and can be at least two, or at least three, at least four, at least five, or at least six ingredients.

In one aspect, the first monomer of the photocurable compositions can have a higher vapor pressure than the second monomer, wherein the ratio of the vapor pressure of the first monomer to the second monomer can be at least 3. In certain other aspects, the vapor pressure ratio between the first monomer and the second monomer can be at least 5, or at least 10, or at least 20, or at least 30, or at least 50, or at least 80, or at least 100. As used herein, if not indicated otherwise, the term "photocurable compositions" relate to both the first photocurable composition and the second photocurable composition.

In one embodiment, the first polymerizable material can comprise a first weight percent ratio of the first monomer to the second monomer, and the second polymerizable material can comprise a second weight percent ratio of the first monomer to the second monomer, wherein the first weight percent ratio and the second weight percent ratio can be different.

In one aspect, the second weight percent ratio of the first monomer to the second monomer can be greater than the first weight percent ratio of the first monomer to the second monomer. In a certain aspect, a difference between the second weight percent ratio and the first weight percent ratio can be at least 1.5, or at least 3, or at least 5, or at least 10.

In one embodiment, after merging the first photocurable composition and the second photocurable composition to a combined liquid photocurable layer, the combined layer can have a third weight percent ratio of the first monomer to the second monomer, wherein the third weight percent ratio may be substantially the same as the first weight percent ratio. As used herein, substantially the same means that the weight percent ratios differ not more than ±1%.

In another embodiment, the third weight percent ratio may be different than the first weight percent ratio after merging the first and second photocurable compositions. In a certain aspect, the weight percent ratios may be different only at certain regions of the combined layer on the substrate, where a different property profile of the produced photo-cured may be desired.

The method of the present disclosure can further include conducting pre-trials by forming a photo-cured layer only of the first photocurable composition under typical processing conditions. The obtained photo-cured layer can be analyzed with regard to identifying locations or regions wherein a loss of volume has occurred caused by the evaporation of the monomer with the highest vapor pressure (herein also called the "first monomer"). Based thereon, a second photocurable composition can be developed containing the same monomer types as the first photocurable composition but including a different ratio of the first monomer to the second monomer in order to compensate for the loss of the first monomer in the first photocurable composition. Furthermore, it can be pre-calculated at which locations of the substrate the addition of the second photocurable composition may be of benefit in order to compensate the volume loss and to correct the desired ratio of the monomers within the first photocurable composition.

In one embodiment, the first photocurable composition can be applied onto a substrate by dispensing a plurality of droplets of the first photocurable composition onto the substrate using a first dispenser, followed by applying a plurality of droplets of the second photocurable composition with a second dispenser (not shown) at pre-determined regions and amounts to compensate the loss of the first monomer within the first photocurable composition.

In one aspect, the droplets of the second photocurable composition can be applied shortly after the depositing of the droplets of the first photocurable composition, even before all droplets of the first photocurable composition have been merged to a unified liquid layer. In another aspect, a first liquid layer may be formed by adding and merging of the droplets of the first photocurable composition to a continuous liquid layer, followed by adding droplets of the second photocurable composition at pre-determined locations and amounts onto the liquid layer of the first photocurable composition.

The applied first photocurable composition and second photocurable composition can easily mix with each other to form the combined liquid photocurable layer having a very even distribution of the first and second monomer.

The even distribution of the monomers within the combined liquid layer can have the advantage that a photo-cured layer may be formed with a very homogeneous material structure. The homogeneous material structure can be indirectly expressed by the property of an even etch rate or an even carbon content throughout the photo-cured layer.

In one embodiment, the etch rate variation throughout the photo-cured layer can be not greater than 10%, or not greater than 5%, or not greater than 3%, or not greater than 2%, or not greater than 1%, or not greater than 0.5%. As used herein, etch resistance applies to all standard etching procedures used during imprint processing, for example $O_2/Ar$, $Cl_2/O_2$, or $CF_4/Ar$ etching.

The homogeneous material structure of the photo-cured layer can be also characterized by the variation of the carbon content throughout the photo-cured layer. In one aspect, the carbon content variation throughout the photo-cured layer can be not greater than 3% based on the average carbon content of the photo-cured layer, or not greater than 2%, or not greater than 1%, or not greater than 0.5%, or not greater than 0.3%, or not greater than 0.1%. As used herein, the carbon content variation is a variation between a maximum carbon content and a minimum carbon content measured for a series of at least 5 measurements at different positions throughout the photo-cured layer.

In a certain embodiment of the method of the present disclosure, the amount of the first photocurable material of the first photocurable composition can be at least 80 wt % based on the total weight of the first photocurable composition, such as at least 85 wt %, at least 90 wt %, or at least 95 wt %. Furthermore, the amount of the second photocurable material of the second photocurable composition can be also at least 80 wt % based on the total weight of the second photocurable composition, such as at least 85 wt %, or at least 90 wt %, or at least 95 wt %.

In one embodiment, the first monomer of the first polymerizable material of the first photocurable composition and the first monomer of the second polymerizable material of the second photocurable composition can be an acrylate monomer. In another embodiment, the first monomer and the second monomer of each of the two photocurable compositions can be acrylate monomers.

In a further aspect, the first monomer can be a mono-functional monomer and the second monomer may be a multi-functional monomer. For example, in a non-limiting embodiment, the first monomer can be a mono-functional acrylate monomer and the second monomer can be a bi-functional acrylate monomer.

Some non-limiting examples of first monomers can be benzyl acrylate, cyclohexyl acrylate, isobornyl acrylate, dicyclopentyl acrylate, ethylene glycol diacrylate, neopentyl glycol diacrylate, 3-methyl-1,5-pentanediol diacrylate, 1,6-hexanediol diacrylate, or divinyl benzole.

In one aspect, the first monomer can have a vapor pressure of at least 0.005 mm Hg, or at least 0.01 mm Hg, or at least 0.05 mm Hg, or at least 0.07 mm Hg, or at least 0.1 mm Hg, or at least 0.2 mm Hg.

In an embodiment, the step of the photo-curing (14) may be conducted with UV light having a wavelength range between 300 nm and 430 nm.

In one embodiment, the substrate can be a wafer. Non-limiting materials of the substrate can be silicon, fused silica, quartz, silicon germanium, gallium arsenide, indium phosphide, silicon carbide, or silicon nitride.

In a particular embodiment, the substrate can include an adhesion layer overlying an exterior surface of the substrate, and the first and second photocurable compositions can be directly applied on the adhesion layer. As used herein, the term substrate is intended to mean both options, a substrate without an adhesion layer or a substrate including an adhesion layer, unless indicated otherwise.

In one embodiment, the first photocurable composition can comprise a first polymerizable material and a first photoinitiator, and the second photocurable composition can comprise a second polymerizable material and a second photoinitiator.

In aspects, the first photoinitiator of the first photocurable composition and the second photoinitiator of the second photocurable composition can be different or the same.

In one aspect, the first photocurable composition can be any photocurable composition suitable for imprint or other wafer processing which may be applied in a defined manner over a first surface region of a substrate. The polymerizable material can include polymerizable monomers, oligomers, or polymers. Specific non-limiting examples of suitable monomers can be monomers described, for example, in US 2018/0272634, which is expressly incorporated by reference herein.

As used herein, unless indicated otherwise, the term "acrylate monomer" addresses monomers containing an alkyl substitution, for example, methacrylate, or monomers wherein the acrylate groups do not contain any substitutions.

In another embodiment, the first photocurable composition can be essentially free of a solvent and the second photocurable composition may comprise a solvent.

As used herein, if not indicated otherwise, the term solvent relates to a compound which can dissolve or disperse the polymerizable monomers but does not itself polymerize during the photo-curing of the photocurable composition. The term "essentially free of a solvent" means herein an amount of solvent being not greater than 5 wt % based on the total weight of the photocurable composition. In a certain particular aspect, the amount of a solvent can be not greater than 3 wt %, not greater than 2 wt %, not greater than 1 wt %, or the photocurable composition can be free of a solvent, except for unavoidable impurities.

In another aspect, both the first photocurable composition and the second photocurable composition can comprise a solvent.

In a particular embodiment, the first photocurable composition and the second photocurable composition can both have a low viscosity to facilitate forming of a thin and homogeneous combined liquid layer on the substrate. In one aspect, the viscosity of the first and second photocurable compositions can be not greater than 100 mPa s, such as not greater than 50 mPa s, or not greater than 30 mPa s, or not greater than 20 mPa s, or not greater than 15 mPa s, or not greater than 12 mPa s, or not greater than 10 mPa s. In another aspect, the viscosity of the first and second photocurable compositions can be at least 1 mPa s, or at least 3 mPa s, or at least 5 mPa s. As used herein, all viscosities are measured at 23° C. with a Brookfield viscometer.

In a particular aspect, the difference of the viscosity of the first photocurable composition to the viscosity of the second photocurable composition may be not greater than 20 mPa s, such as not greater than 15 mPa s, or not greater than 10 mPa s, or not greater than 5 mPa s.

The present disclosure is further directed to a method of forming an article. The method can comprise forming a photo-cured layer on a substrate as described above. The substrate and the photo-cured layer may be subjected to additional processing to form the desired article, for example, by including an etching process to transfer an image into the substrate that corresponds to the pattern in one or both of the solidified layers and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

Investigation of Evaporation of Resist Monomers

On a silicon wafer is deposited a 50 nm thick liquid layer of a first resist composition (R1) containing a polymerizable material including a first monomer (M1) and a second monomer (M2), wherein the ratio of the vapor pressure of the first monomer (M1) to the vapor pressure of the second monomer (M2) is at least 3 or greater.

Figure 2A:
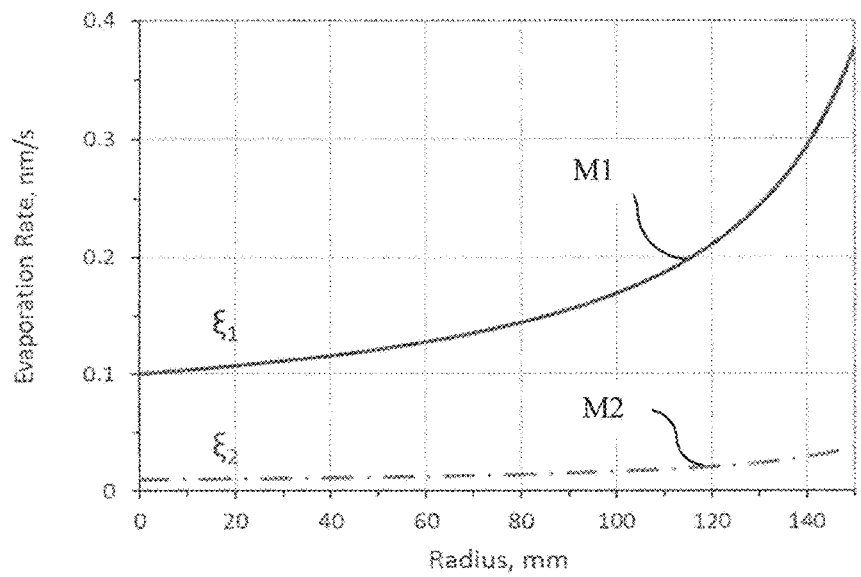
FIG. 2A illustrates the evaporation profile of monomers M1 and M2 of a liquid resist layer R1 throughout the radius of the substrate.

The evaporation rate of the first monomer (M1) and second monomer (M2) is measured throughout the radius of the wafer, which is showing a profile as illustrated in FIG. 2A.

Based on the measured evaporation profile, a second resist composition (R2) is designed which also includes the first monomer (M1) and the second monomer (M2), but at a different ratio then in R1, such that resist composition R2 can compensate the evaporation loss of monomer M1 in resist R1.

A calculation is made at which locations and which amounts of resist composition R2 will be needed to compensate the evaporation loss of monomer M1 in resist composition R1 to reach the original monomer concentrations of M1 and M2 in the applied layer of R1.

Based on the pretesting and calculations, a photo-cured layer is prepared by first applying a liquid resist layer of R1 using a first dispenser, followed by adding resist composition R2 with a second dispenser at pre-determined locations and amounts to compensate for the loss of monomers due to evaporation during further processing.

The addition of resist composition R2 to resist composition R1, both of which evaporate, leads after merging of R1 and R2 to combined resist composition R3, wherein the following relationships between the weight percent ratios of monomer M1 to monomer M2 in compositions R1, R2, and R3 exist:

$$W_{ratio1} < W_{ratio2}; \text{ and } W_{ratio1} = W_{ratio3},$$

with $W_{ratio\ 1}$ being the ratio of M1 to M2 in resist composition R1; $W_{ratio2}$ being the ratio of M1 to M2 in resist composition R2, and $W_{ratio3}$ being the ratio of M1 to M2 in resist composition R3.

Figure 2B:
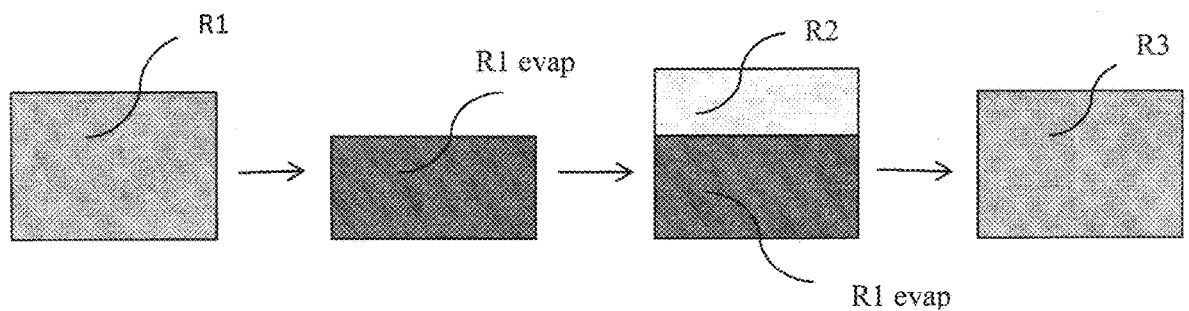
FIG. 2B is a line drawing illustrating the compensation of the loss of monomer M1 in resist R1 by adding resist R2 according to one embodiment.

An illustration showing the forming of the combined liquid resist layer R3 by the combination of R1 and R2 is shown in FIG. 2B, without indicating the weight percent ratios of R1, R2, and R3, and without specifying at which locations R2 is being added.

The combined liquid resist layer R3 is photo-cured by applying UV radiation through a light transmissive outer surface of the superstrate which is in touch with the combined liquid layer.

The obtained photo-cured layer has a very even material structure throughout the layer with an etch rate variation throughout the layer not greater than 5%.

An exemplary resist composition specifying monomer M1 and monomer M2 is shown in Table 1, indicating also the vapor pressures of M1 and M2. The composition is further containing 3 wt % photoinitiator, such as Omnirad 819 or TPO and 2 wt % surfactant, such as Pluronic L44. This composition can be applied for resist 1 and resist 2, wherein only the weight percent ratio of M1 to M2 differs between both resist compositions.

TABLE 1

| Ingredient | Monomer | Vapor pressure [mmHg] |
| --- | --- | --- |
| Benzyl acrylate | M1 | 0.07 |
| 1,6 hexanediol diacrylate | M2 | 0.02 |

Measuring of Etch Resistance

In a non-limiting example, the etch resistance is measured via oxygen plasma etching using a Trion Oracle multi-chamber dry processing system TBW CH1. The conditions for the etching are as following: $O_2$ flow [sccm]=2; Ar flow [sccm]=10; RIE power [Watt]=45; pressure [mTorr]=10; and helium BP [Torr]=5.

For measuring the etch resistance variation, at least five different locations throughout the layer are selected and subjected to etching. The etch resistance variation is being calculated as the difference between the values of the highest etch resistance and the lowest etch resistance, and expressed as percent based on the average etch resistance of the at least five measurements, setting the average edge resistance to 100%.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of forming a photo-cured layer on a substrate, comprising:
    applying a first photocurable composition overlying at least a first region of the substrate, the first photocurable composition comprising a first polymerizable material;
    applying a second photocurable composition overlying at least partially the first photocurable composition and/or at least a second region of the substrate, the second photocurable composition comprising a second polymerizable material;
    contacting the first photocurable composition and the second photocurable composition with a superstrate or a template to form a combined liquid photocurable layer;
    photo-curing the combined liquid layer to form the photo-cured layer; and
    removing the superstrate or the template,
    wherein
    the first polymerizable material and the second polymerizable material both comprise a first monomer and a second monomer, wherein a ratio of a vapor pressure of the first monomer to a vapor pressure of the second monomer is at least 3 at standard ambient temperature and pressure; and
    the first polymerizable material comprises a first weight percent ratio of the first monomer to the second monomer, the second polymerizable material comprises a second weight percent ratio of the first monomer to the second monomer, wherein the first weight percent ratio and the second weight percent ratio are different.

2. The method of claim 1, wherein an amount and location of applying the second photocurable composition are pre-calculated to compensate for an evaporation of the first photocurable composition.

3. The method of claim 1, wherein the photo-cured layer has an etch rate variation of not greater than 5%.

4. The method of claim 1, wherein the first monomer has a vapor pressure of at least 0.01 mmHg at standard ambient temperature and pressure.

5. The method of claim 1, wherein the combined layer comprises a third weight percent ratio of the first monomer to the second monomer, and the third weight percent ratio is substantially the same as the first weight percent ratio.

6. The method of claim 1, wherein the combined layer comprises a third weight percent ratio of the first monomer to the second monomer, and wherein the first weight percent ratio, the second weight percent ratio, and the third weight percent ratio are different.

7. The method of claim 1, wherein the combined liquid photocurable layer comprises a third weight percent ratio of the first monomer to the second monomer, and wherein a variation of the third weight percent ratio throughout the combined liquid photocurable layer is not greater than 5% based on the total third weight percent ratio.

8. The method of claim 1, wherein the second weight percent ratio of the first monomer to the second monomer is greater than the first weight percent ratio of the first monomer to the second monomer.

9. The method of claim 8, wherein a difference between the second weight percent ratio and the first weight percent ratio is at least 1.5.

10. The method of claim 1, wherein the photo-cured layer has a carbon content variation throughout the photo-cured layer of not greater than 2.0%.

11. The method of claim 10, wherein the photo-cured layer has a carbon content variation throughout the photo-cured layer of not greater than 1.0%.

12. The method of claim 1, wherein the first monomer is an acrylate monomer.

13. The method of claim 12, wherein the first monomer and the second monomer are acrylate monomers.

14. The method of claim 1, wherein the first monomer is a mono-functional monomer and the second monomer is a multi-functional monomer.

15. The method of claim 1, wherein the ratio of the vapor pressure of the first monomer to the vapor pressure of the second monomer is at least 7 at standard ambient temperature and pressure.

16. The method of claim 1, wherein an amount of the first polymerizable material of the first photocurable composition is at least 80 wt % based on the total weight of the first photocurable composition, and an amount of the second polymerizable material of the second photocurable composition is at least 80 wt % based on the total weight of the second photocurable composition.

17. The method of claim 1, wherein the method is adapted for nanoimprint lithography or inkjet adaptive planarization, and the first photocurable composition is a first imprint resist, and the second photocurable composition is a second imprint resist.

18. The method of claim 1, wherein a viscosity of the first photocurable composition is not greater than 50 mPa·s at 23° C., and a viscosity of the second photocurable composition is not greater than 50 mPa·s at 23° C.

19. The method of claim 1, wherein the photo-cured layer has an etch-rate variation of not greater than 1%.

20. A method of forming an article, comprising
applying a first photocurable composition overlying at least a first region of a substrate, the first photocurable composition comprising a first polymerizable material;
applying a second photocurable composition overlying at least partially the first photocurable composition and/or at least a second region of the substrate, the second photocurable composition comprising a second polymerizable material;
contacting the first photocurable composition and the second photocurable composition with a superstrate or a template to form a combined liquid photocurable layer;
photo-curing the combined liquid layer to form a photo-cured layer; and
removing the superstrate or the template from the photo-cured layer; and
processing the substrate with the photo-cured layer to make the article, wherein
the first polymerizable material and the second polymerizable material both comprise a first monomer and a second monomer, wherein a ratio of a vapor pressure of the first monomer to a vapor pressure of the second monomer is at least 3 at standard ambient temperature and pressure;
the first polymerizable material comprises a first weight percent ratio of the first monomer to the second monomer, the second polymerizable material comprises a second weight percent ratio of the first monomer to the second monomer, wherein the first weight percent ratio and the second weight percent ratio are different.

* * * * *